US010778176B2

(12) United States Patent
Pierce et al.

(10) Patent No.: US 10,778,176 B2
(45) Date of Patent: Sep. 15, 2020

(54) CMOS GUANELLA BALUN

(71) Applicant: RAYTHEON COMPANY, Waltham, MA (US)

(72) Inventors: Richard G. Pierce, Waltham, MA (US); Robert S. Isom, Waltham, MA (US); Brandon W. Pillans, Waltham, MA (US); Mikel White, Waltham, MA (US); David D. Heston, Waltham, MA (US); John G. Heston, Waltham, MA (US)

(73) Assignee: Raytheon Company, Waltham, MA (US)

( * ) Notice: Subject to any disclaimer, the term of this patent is extended or adjusted under 35 U.S.C. 154(b) by 40 days.

(21) Appl. No.: 16/203,763

(22) Filed: Nov. 29, 2018

(65) Prior Publication Data

US 2020/0177151 A1    Jun. 4, 2020

(51) Int. Cl.
| | |
|---|---|
| *H03H 7/42* | (2006.01) |
| *H01P 5/10* | (2006.01) |
| *H03H 7/38* | (2006.01) |
| *H01F 41/04* | (2006.01) |

(52) U.S. Cl.
CPC ............ *H03H 7/38* (2013.01); *H01F 41/041* (2013.01); *H01P 5/10* (2013.01); *H03H 7/42* (2013.01)

(58) Field of Classification Search
CPC .............. H03H 7/42; H03H 7/38; H01P 5/10
USPC .......................................................... 333/25
See application file for complete search history.

(56) References Cited

U.S. PATENT DOCUMENTS

| | | | |
|---|---|---|---|
| 4,954,790 A * | 9/1990 | Barber ................. | H03D 9/0633 |
| | | | 332/164 |
| 5,808,518 A | 9/1998 | McKinzie, III et al. | |
| 6,993,312 B1 * | 1/2006 | Salib .................... | H03D 9/0633 |
| | | | 455/323 |
| 7,068,104 B2 | 6/2006 | Burns et al. | |
| 7,436,203 B1 | 10/2008 | Hidri et al. | |
| 8,638,181 B2 | 1/2014 | Gerst et al. | |
| 9,276,056 B2 | 3/2016 | Akhtar et al. | |
| 9,548,706 B2 | 1/2017 | Thomas et al. | |
| 9,634,614 B2 | 4/2017 | Mu | |
| 9,859,844 B1 * | 1/2018 | Amiot ....................... | H03F 3/26 |
| 2012/0145741 A1 | 6/2012 | Yen et al. | |

(Continued)

FOREIGN PATENT DOCUMENTS

| | | |
|---|---|---|
| EP | 2388858 A1 | 11/2011 |
| KR | 101266955 B1 | 5/2013 |

OTHER PUBLICATIONS

Boglione et al.; "Experimental demonstration of a tunable Marchand balun at K band in Silicon Germanium (SiGe) technology," Naval Research Laboratory, Washington, DC; 6 pages, Apr. 2015.

(Continued)

*Primary Examiner* — Dean O Takaoka
(74) *Attorney, Agent, or Firm* — Burns & Levinson, LLP; Joseph M. Maraia

(57) ABSTRACT

Guanella topology balun/unun impedance transformer contains cascaded, i.e., series-coupled, coils of different sizes implemented in RF CMOS technology. The cascading of differently-sized coils provides for a large resonance-free operating bandwidth. The shunt inductive loading maximizes low frequency performance.

17 Claims, 5 Drawing Sheets

(56) References Cited

U.S. PATENT DOCUMENTS

2013/0069736 A1* 3/2013 Wu .................. H01P 5/10
                                              333/26
2013/0127575 A1  5/2013 Paek et al.
2016/0142036 A1* 5/2016 Akhtar ............... H03H 7/42
                                              336/192
2016/0217904 A1  7/2016 Vanukuru

OTHER PUBLICATIONS

Zhu et al.; "Modified Wideband Machand Balun with Tunable Power Division Ratio and Constant Phase;" IEEE Microwave and Wireless Components Letters, vol. 26, No. 5; May 2016; pp. 319-321.

Ruthroff; "Some Broad-Band Transformers;" Original manuscript received by the IRE; Feb. 5, 1959; pp. 1337-1342.

Guanella; "New Method of Impedance Matching in Radio-Frequency Circuits;" The Brown Boveri Review; Sep. 1944; 3 pages.

International Search Report and Written Opinion from related PCT Application No. PCT/US2019/039413, dated Oct. 25, 2019.

* cited by examiner

CMOS GUANELLA BALUN

GOVERNMENT RIGHTS

This invention was made with Government support under a withheld contract. The Government has certain rights in the invention.

BACKGROUND

A balun, sometime referred to as a balun transformer, is a two port device or circuit that transforms a signal from a balanced transmission line into a signal for an unbalanced transmission line and vice versa. The balun has an unbalanced port, referenced to ground, and a balanced port with two terminals—each referenced to the other. This is generally described in U.S. Pat. No. 8,638,181 to Gerst, et al., which is hereby incorporated by reference for all purposes. Balun transformers are used to transform balanced and unbalanced signals in, for example, antenna feed circuitry and push-pull amplifiers.

The "Guanella balun" is a well-known circuit configuration that is characterized by its impedance ratios. More specifically, an x:y Guanella balun has an unbalanced port impedance that is x/y times its balanced port impedance where Guanella baluns with ratios of 1:1, 1:4 and 4:1 are common. Known Guanella baluns use magnetic material in order to increase the impedance seen by common mode currents as a higher common mode impedance improves the balun performance.

As discussed in U.S. Pat. No. 9,276,056 to Akhtar, et al., which is hereby incorporated by reference for all purposes, radio frequency (RF) circuitry uses differential signaling to eliminate common mode noise and increase dynamic range. The signals received by an antenna, or transmitted by an antenna, however, are single-ended and a balun is implemented to convert from single-ended to differential or from differential to single-ended. In addition to providing signal conversion, baluns also provide impedance transformation between preceding and following stages for maximizing power and signal transfer.

Akhtar, et al., also disclose a balun having a differential primary (or secondary) inductor winding and a single-ended secondary (or primary) inductor formed in a stacked configuration. The balun is formed using layers of metal available in a CMOS fabrications process.

What is needed, however, is an improved balun device.

SUMMARY

In one aspect of the present disclosure, a Guanella balun comprises a substrate; a first pair of first and second generally planar coupled coils, interleaved with one another, and formed on the substrate by a CMOS process, each coil comprising multiple turns and having a respective input and output, the interleaved coils including a first plurality of crossings between turns of the respective coils, wherein each of the crossings of the first plurality of crossings is structured to match an impedance on each side of the crossing; a second pair of third and fourth generally planar coupled coils, interleaved with one another and formed on the substrate by the CMOS process, each coil comprising multiple turns and having a respective input and output, the interleaved coils including a second plurality of crossings between turns of the respective coils, wherein each of the crossings of the second plurality of crossings is structured to match an impedance on each side of the crossing; and an inductive coil formed on the substrate by the CMOS process, the inductive coil having first and second ends, wherein the output of the first coil is coupled to the input of the third coil and the first end of the inductive coil, and wherein a first diameter of the first pair of interleaved coils and a second diameter of the second pair of stacked coils are different from one another.

In one aspect of the Guanella balun, a ratio of the first diameter to the second diameter is not an integer value. In another aspect, a shape of the inductive coil is one of rectangular or octagonal.

In one aspect of the Guanella balun, a width of a coil at each crossing and a spacing between the coils in each pair of interleaved coils are structured to provide the matched impedances.

In one aspect of the Guanella balun, a first switch is configured to, in a first state, couple a first section of the first coil to a second section of the first coil and, in a second state, couple the first section of the first coil to a first node; a second switch is configured to, in a first state, couple a first section of the second coil to a second section of the second coil and, in a second state, couple the first section of the second coil to a second node; a third switch is configured to, in a first state, couple a first section of the third coil to a second section of the third coil and, in a second state, couple the first section of the third coil to a third node; a fourth switch is configured to, in a first state, couple a first section of the fourth coil to a second section of the fourth coil and, in a second state, couple the first section of the fourth coil to a fourth node; a fifth switch is configured to, in a first state, couple the second section of the first coil to the first section of the third coil and, in a second state, couple the first section of the third coil to the first node; a sixth switch is configured to, in a first state, couple the second section of the third coil to a first output node and, in a second state, couple the first output node to the second node; a seventh switch is configured to, in a first state, couple the second section of the second coil to the first section of the fourth coil and, in a second state, couple the first section of the fourth coil to the third node; and an eighth switch is configured to, in a first state, couple the second section of the fourth coil to a second output node and, in a second state, couple the second output node to the fourth node.

Another aspect of the Guanella balun includes a first switching circuit coupled to the first coil and configured to, in a first state, bypass a section of the first coil; a second switching circuit coupled to the second coil and configured to, in a first state, bypass a section of the second coil; a third switching circuit coupled to the third coil and configured to, in a first state, bypass a section of the third coil; and a fourth switching circuit coupled to the fourth coil and configured to, in a first state, bypass a section of the fourth coil.

In another aspect of the present disclosure, a Guanella balun comprises a substrate; a first pair of first and second generally planar coupled coils, interleaved with one another, and formed on the substrate by a CMOS process, each coil comprising multiple turns and having respective first and second ends, the interleaved coils including a first plurality of crossings between turns of the respective coils, wherein each of the crossings of the first plurality of crossings is structured to match an impedance on each side of the crossing; a first output node coupled to the second end of the first coil; a second output node coupled to the second end of the second coil; an inductive coil formed on the substrate by the CMOS process, the inductive coil having a first end and a second end, the first end of the inductive coil coupled to the first output node; a first switching circuit coupled to the first coil and configured to, in a first state, bypass a section of the first coil; and a second switching circuit coupled to the second coil and configured to, in a first state, bypass a section of the second coil.

Each of the switches further comprises one or more of: at least one FET device; a pin diode switch; or a bipolar transistor (BJT).

Further, an aspect of the present disclosure is directed to a Guanella balun comprising: a substrate; a first pair of first and second generally planar coupled coils, interleaved with one another, and formed on the substrate by a CMOS process, each coil comprising multiple turns and having respective first and second ends, the interleaved coils including a first plurality of crossings between turns of the respective coils, wherein each of the crossings of the first plurality of crossings is structured to match an impedance on each side of the crossing; a first output node coupled to the second end of the first coil; a second output node coupled to the second end of the second coil; an inductive coil formed on the substrate by the CMOS process, the inductive coil having a first end and a second end, the first end of the inductive coil coupled to the first output node; a first switching circuit coupled to the first coil and configured to, in a first state, bypass a section of the first coil; and a second switching circuit coupled to the second coil and configured to, in a first state, bypass a section of the second coil.

In one aspect, the first switching circuit comprises a first switch configured to, in a first state, couple a first section of the first coil to a second section of the first coil and, in a second state, couple the first section of the first coil to a first node; a second switch configured to, in a first state, couple the second end of the first coil to a first output node and, in a second state, couple the first output node to the first node; a third switch configured to, in a first state, couple a first section of the second coil to a second section of the second coil and, in a second state, couple the first section of the second coil to second node different from the first node; and a fourth switch configured to, in a first state, couple the second end of the second coil to a second output node and, in a second state, couple the second output node to the second node.

BRIEF DESCRIPTION OF THE DRAWINGS

Various aspects of the disclosure are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The Figures are provided for the purposes of illustration and explanation and are not intended as a definition of the limits of the disclosure. In the Figures.

DETAILED DESCRIPTION

Details are set forth in order to provide a thorough understanding of the aspects of the disclosure. It will be understood by those of ordinary skill in the art that these may be practiced without some of these specific details. In other instances, well-known methods, procedures, components and structures may not have been described in detail so as not to obscure the aspects of the disclosure.

Generally, and as will be described in more detail below, one aspect of the present disclosure is directed to a Guanella topology balun/unun impedance transformer containing cascaded, i.e., series-coupled, coils implemented in RF CMOS technology as, for example, traces on a substrate. In one aspect, shunt inductive loading is provided and the cascaded coils are of different sizes. Advantageously, the shunt inductive loading maximizes low frequency performance and the cascade of coils of different sizes enables a large resonance-free bandwidth of operation.

Figure 1:
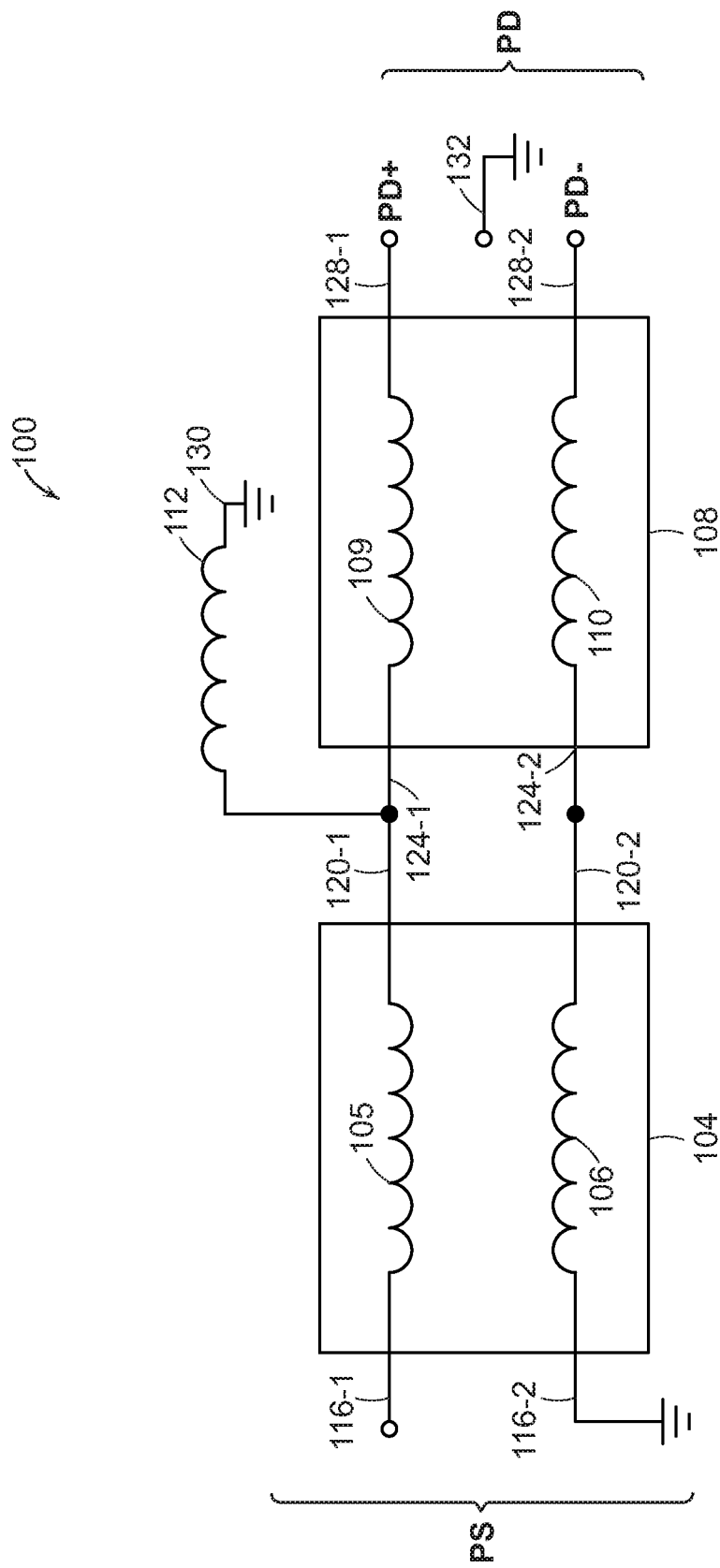
FIG. 1 is an electrical schematic diagram of a Guanella balun device in accordance with an aspect of the present disclosure.

Referring to FIG. 1, which is an electrical schematic a Guanella balun device 100 in accordance with an aspect of the present disclosure includes a first coil pair circuit 104 including a first coil 105 and a second coil 106, a second coil pair circuit 108 including a third coil 109 and a fourth coil 110, and an inductive coil 112. Each of the first and second coil pair circuits 104, 108 has respective first and second input nodes (116-1, 116-2)(124-1, 124-2) and first and second output nodes (120-1, 120-2)(128-1, 128-2). The first input node of the second coil pair circuit is coupled to the first output node of the first coil pair circuit and the second input node of the second coil pair circuit is coupled to the second output node of the first coil pair circuit. The inductive coil is coupled between the first output of the first coil pair circuit and a ground node 130.

Generally, the device 100 operates with the first and second input nodes of the first coil pair circuit configured as a single-ended port PS where the first input is arranged to receive/transmit a single-ended signal and the second input port is coupled to ground. The first and second output nodes of the second coil pair circuit are configured as a differential port PD where the first output node is a positive node PD+ and the second output node is a negative node PD−. As shown, a reference node 132, i.e., coupled to ground, is included. As the device 100 is operable bi-directionally, as understood by those of ordinary skill in the art, the differential port PD can transmit or receive a differential signal.

Figure 2:
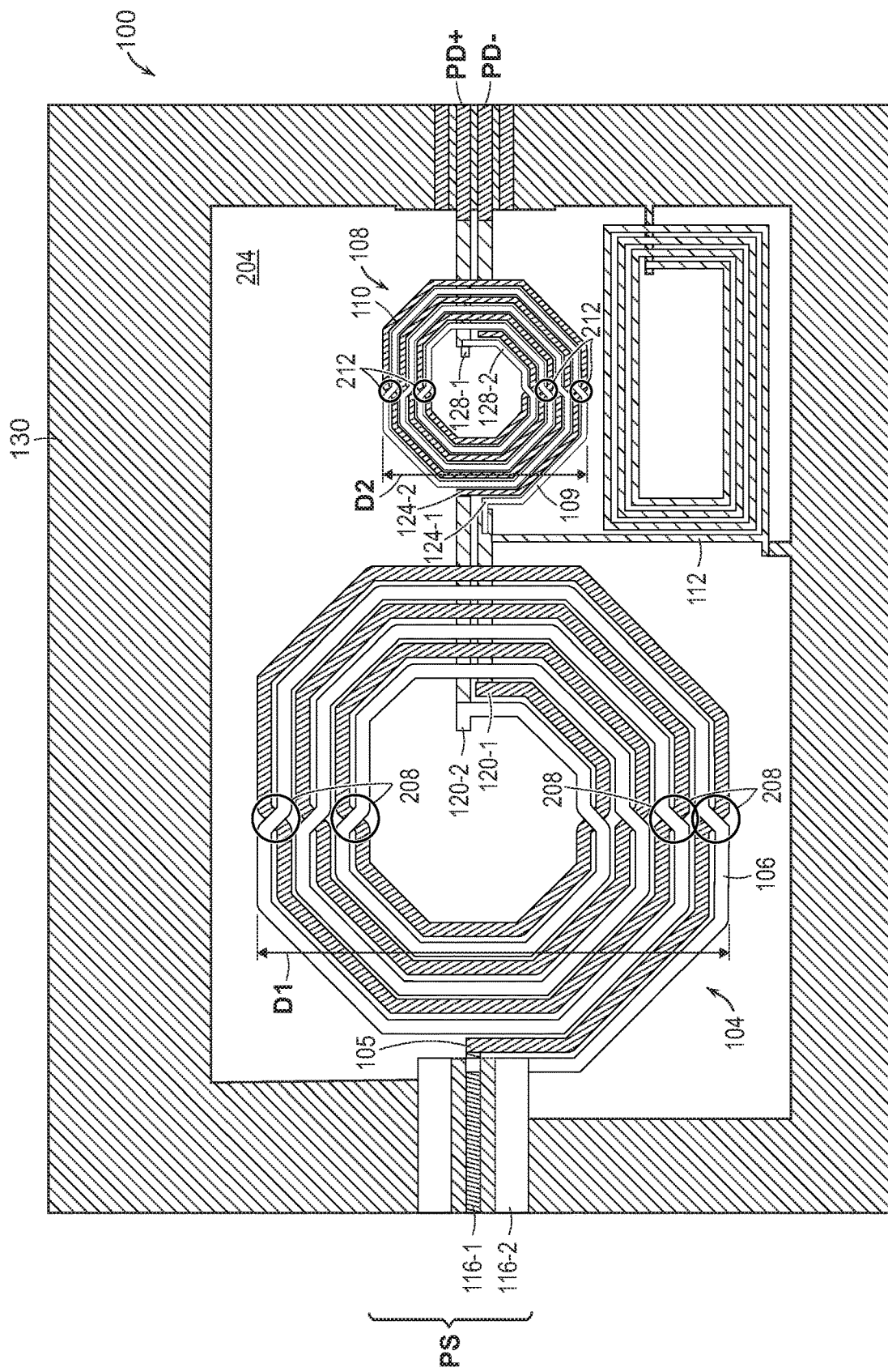
FIG. 2 is a representation of the Guanella balun device of FIG. 1 implemented on a CMOS substrate.

In one aspect of the present disclosure, the device 100 is implemented in CMOS, per known manufacturing processes. Referring now to FIG. 2, a substrate 204 has each of the first and second coil pair circuits 104, 108 provided thereon as a pair of first and second generally planar coupled coil traces (105, 106), (109, 110), interleaved with, i.e., "crossed-over" or "crossed-under," one another, and formed on the substrate 204 by a known CMOS process as is well understood by those of ordinary skill in the art.

Each coil trace 105, 106, 109, 110 comprises multiple turns and the interleaved coils 105, 106 of the first coil pair circuit 104 include a first plurality of crossings 208 between turns of the respective coils. The interleaved coils 109, 110 of the second coil pair circuit 108 includes a second plurality of crossings 212 between turns of the respective coils 109, 110. Advantageously, each of the crossings 208, 212 of the first and second pluralities of crossings is structured to match an impedance on each side of the respective crossing 208, 212. The inductive coil 112 is also formed on the substrate as a trace by the CMOS process and, per the schematic in FIG. 1, the output 120-1 of the first coil 105 is coupled to the input of the third coil 109 and the first end of the inductive coil 112. Further, a ground plane 130 is provided on the substrate.

Figure 3:
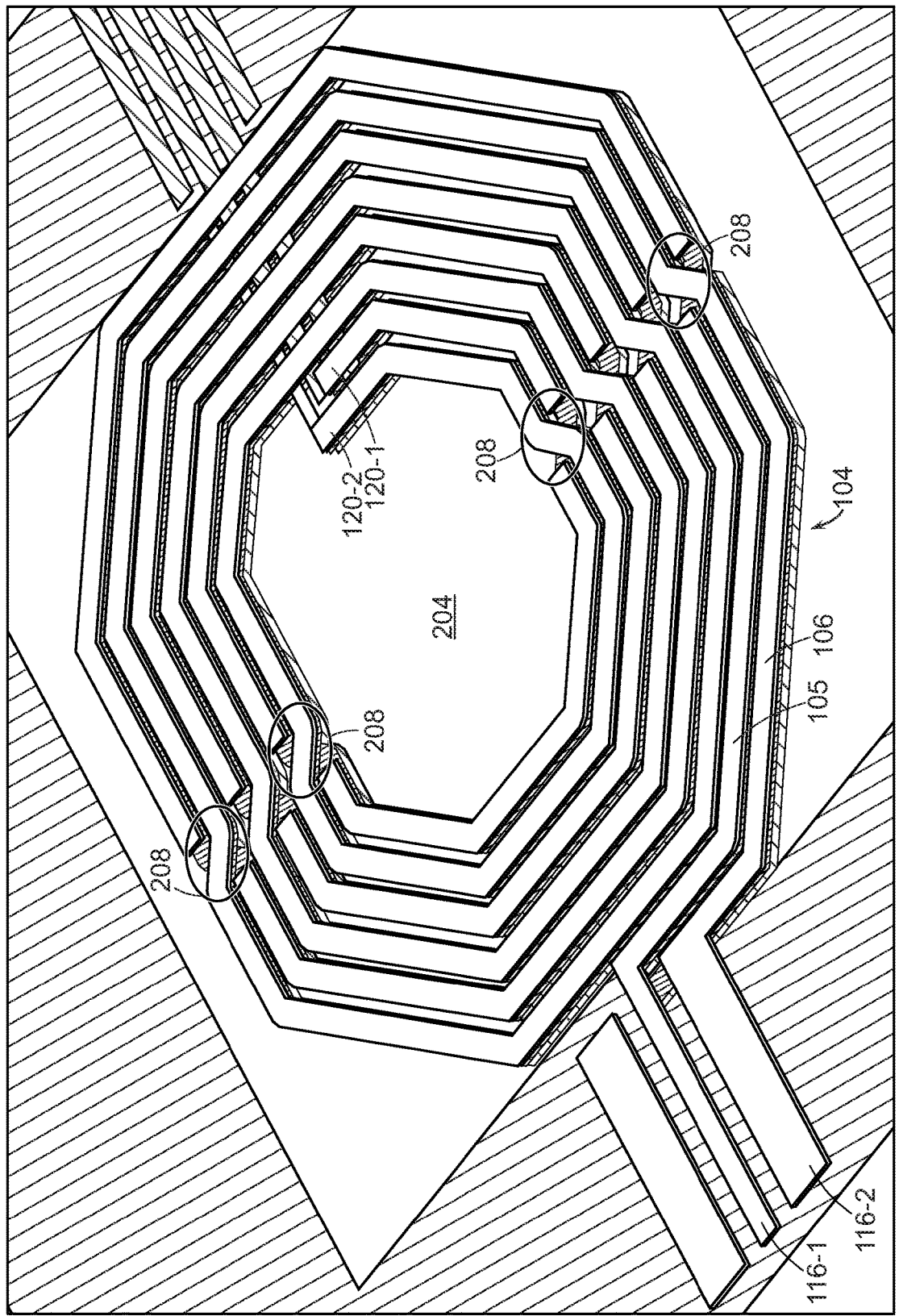
FIG. 3 is a representation of one pair of coupled coils implemented in CMOS in accordance with an aspect of the present disclosure.

In one aspect, the device 100 is formed using metal layers available in, for example, a digital CMOS fabrication process, as shown in FIG. 3, where the first or second coil is formed at a level of a single available thick copper (Cu) metal layer, and the other coil is formed at a level of a single available thick aluminum (Al) top metal bonding layer. The crossovers (cross-unders) are formed using available underlying thin metal layers.

A first diameter D1 of the first pair of interleaved coils 104 and a second diameter D2 of the second pair of interleaved coils 108 are different from one another. In one aspect of the present disclosure, the first diameter D1 is larger than the second diameter D2. Further, the diameters of the two are set such that a ratio D1:D2 is not an integer value.

In one aspect of the present disclosure, a general shape of the inductive coil is rectangular although it could be implemented as an octagonal.

Figure 4:
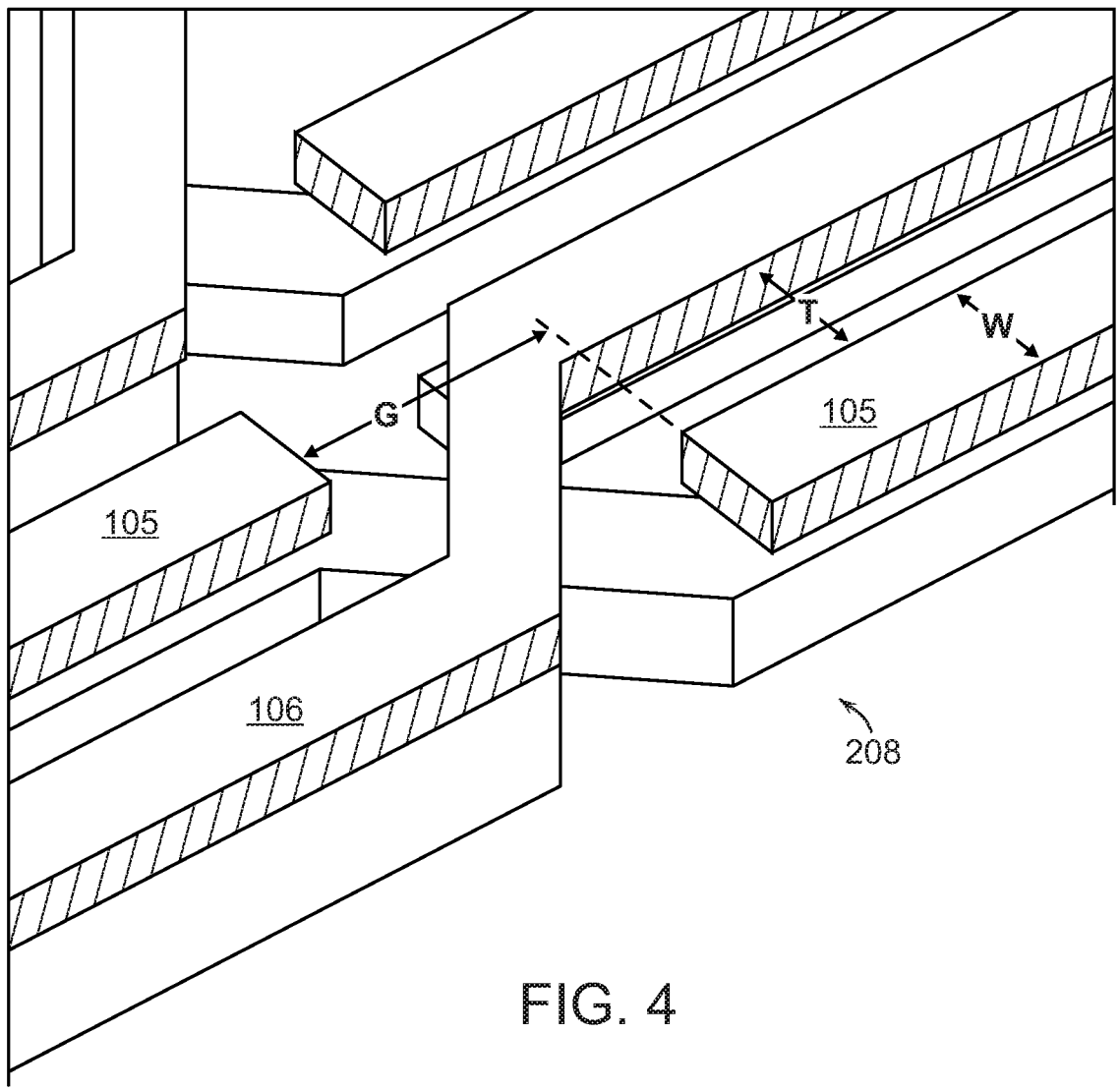
FIG. 4 is a close-up view of a crossing of coupled coils as presented in FIG. 3.

In an aspect of the present disclosure, impedance matching is provided in the layers of traces that cross over each other as will be discussed with reference to FIG. 4, a close-up of a crossover portion 208 of a coil trace. The impedance is matched by selecting values for a width W of the trace 105 that "crosses under," a distance T between the coils and a linear gap G from where the "crossing under" trace 105 "ends" or "stops." Each of these values can be adjusted to compensate for a change in any of the others. As is known in the art, the impedance value can be determined by the use of known CAD modeling software tools with prototypes being made to confirm the modeling and the values.

Advantageously, the "cascade" of multiple coil sizes, as set forth above, provides for large resonance-free bandwidths.

Figures 5, 6:
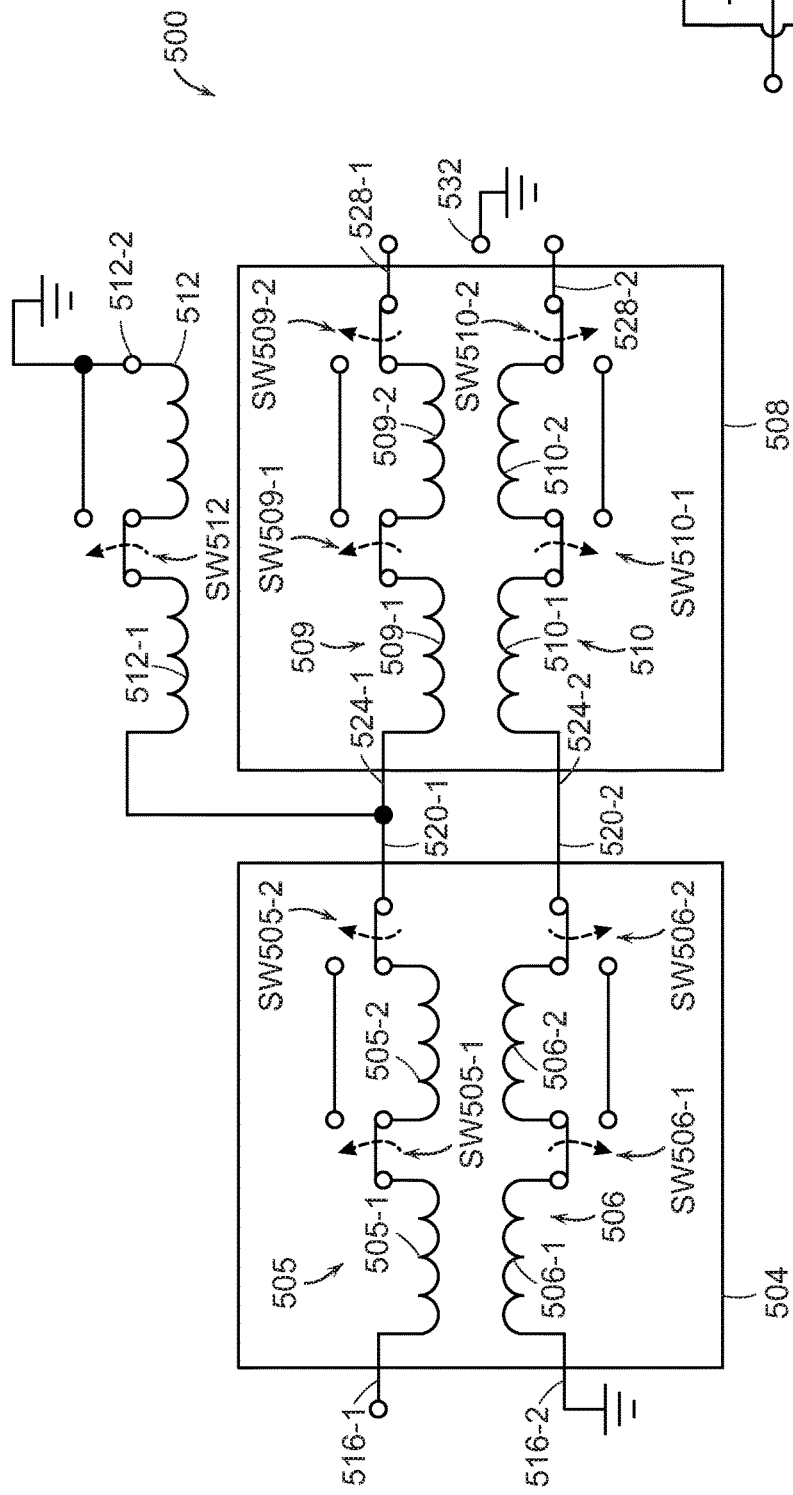
FIG. 5 is a tunable Guanella balun device in accordance with another aspect of the present disclosure.
FIG. 6 is a switching circuit in accordance with an aspect of the present disclosure.

In another aspect of the present disclosure, referring now to FIG. 5, an electrical schematic, a tunable Guanella balun device 500 in accordance with an aspect of the present disclosure includes a first switched coil pair circuit 504 including a first coil 505 and a second coil 506, a second coil pair circuit 508 including a third coil 509 and a fourth coil 510, and a switched inductive coil 512. Each of the first and second switched coil pair circuits 504, 508 has respective first and second input nodes (516-1, 516-2)(524-1, 524-2) and first and second output nodes (520-1, 520-2)(528-1, 528-2). The first input node of the second switched coil pair circuit is coupled to the first output node of the first switched coil pair circuit and the second input node of the second switched coil pair circuit is coupled to the second output node of the first switched coil pair circuit. The switched inductive coil is coupled between the first output of the first switched coil pair circuit and a ground node. The device 500 is implemented in CMOS per known processes.

Each coil in the first and second switched coil pair circuits 504, 508 includes sub-sections and respective switches to couple or decouple the sub-sections from one another. Accordingly, the first coil 505 includes sub-sections 505-1, 505-2 and switches SW505-1, SW505-2, as shown. The second coil 506 includes sub-sections 506-1, 506-2 and switches SW506-1, SW506-2, as shown. The third coil 509 includes sub-sections 509-1, 509-2 and switches SW509-1, SW509-2, as shown. The fourth coil 510 includes sub-sections 510-1, 510-2 and switches SW510-1, SW510-2, as shown. The switches are configured to, in one state, couple the respective sub-sections in series with one another and, in another state, bypass, i.e., isolate or operatively remove, one of the sub-sections.

Similarly, the switched inductive coil 512 includes a first coil sub-section 512-1 and a second coil sub-section 512-2 with a switch SW512 configured to, in one state, couple the first and second coil sub-sections in series with one another and, in another state, bypass, i.e., isolate, the respective second coil sub-section.

Each of the first and second switched coil pair circuits 504, 508 is provided as a pair of first and second generally planar coupled coil traces, interleaved with one another, and formed on a substrate by a CMOS process similar to that which has been described above. Each coil trace comprises multiple turns and has a respective first and second end, i.e., an input and output.

Advantageously, the switched coil pair circuits, due to the isolating function of the switches, minimizes high end losses. The ability to switch sections of the device 500 in and out allows for adjusting an operating bandwidth over a wide frequency range in order to terminate the second harmonic of an amplifier and also increase overall efficiency.

Advantageously, the switched inductive coil provides for improved common mode rejection.

Each of the switches may be implemented, in one non-limiting example, with two FETs 604, 606 arranged as shown in FIG. 6 and also implemented in CMOS. Alternatively, the switches may be implemented as a pin diode switch or a bipolar transistor switch.

Generally, the device 500 operates with the first and second input nodes of the first switched coil pair circuit 504 configured as a single-ended port PS where the first input port is arranged to receive/transmit a single-ended signal and the second input port is coupled to ground. The first and second output nodes of the second switched coil pair circuit 508 are configured as a differential port PD where the first output node is a positive node PD+ and the second output node is a negative node PD−. As shown, a reference node 532, coupled to ground, is included. As the device 500 is operable bi-directionally, as understood by those of ordinary skill in the art, the differential port PD can transmit or receive a differential signal.

The interleaved coil pairs (505, 506) (509, 510) include a first plurality of crossings between turns of the respective coils. Advantageously, each of the crossings of the first plurality of crossings is structured to match an impedance on each side of the crossing. The switched inductive coil 512 is also formed on the substrate as a trace by the CMOS process and has first and second ends. As per the schematic in FIG. 5, the output of the first coil is coupled to the input of the third coil and the first end of the inductive coil. Further, a ground plane is provided on the substrate.

Further, aspects of the present disclosure are advantageous over known multi-tapped magnetically coupled baluns/transformers or a known multi-tapped Guanella balun as both of these approaches only change the impedance transformation ratio and not the bandwidth.

Generally, the device 500 operates with the first and second input nodes of the first coil pair circuit configured as a single-ended port PS where the first input is arranged to receive/transmit a single-ended signal and the second input port is coupled to ground. The first and second output nodes of the second coil pair circuit are configured as a differential port PD where the first output node is a positive node PD+ and the second output node is a negative node PD−. As shown, a reference node, i.e., ground, is included. As the device 100 is operable bi-directionally, as understood by those of ordinary skill in the art, the differential port PD can transmit/receive a differential signal.

It is to be understood that the disclosure is not limited in its application to the details of construction and the arrangement of the components set forth herein or illustrated in the drawings as it is capable of implementations or of being practiced or carried out in various ways. Also, it is to be understood that the phraseology and terminology employed herein are for the purpose of description only and should not be regarded as limiting.

Certain features, which are, for clarity, described in the context of separate implementations, may also be provided in combination in a single implementation. Conversely, various features, which are, for brevity, described in the context of a single implementation, may also be provided separately or in any suitable sub-combination.

The present disclosure is illustratively described in reference to the disclosed implementations. Various modifications and changes may be made to the disclosed implementations by persons skilled in the art without departing from the scope of the present disclosure as defined in the appended claims.

What is claimed is:

1. A Guanella balun, comprising:
   a substrate;
   a first pair of first and second generally planar coupled coils, interleaved with one another, and formed on the substrate by a CMOS process, each coil comprising multiple turns and having respective first and second ends, the interleaved coils including a first plurality of crossings between turns of the respective coils, wherein each of the crossings of the first plurality of crossings is structured to match an impedance on each side of the crossing;
   a first output node coupled to the second end of the first coil;
   a second output node coupled to the second end of the second coil;
   an inductive coil formed on the substrate by the CMOS process, the inductive coil having a first end and a second end, the first end of the inductive coil coupled to the first output node;
   a first switching circuit coupled to the first coil and configured to, in a first state, bypass a section of the first coil; and
   a second switching circuit coupled to the second coil and configured to, in a first state, bypass a section of the second coil.

2. The Guanella balun of claim 1, wherein each of the switches further comprises one or more of:
   at least one FET device;
   a pin diode switch; or
   a bipolar transistor (BJT).

3. The Guanella balun of claim 1, wherein a width of a coil at each crossing and a spacing between the coils in the first pair of interleaved coils are structured to provide the matched impedances.

4. The Guanella balun of claim 1, wherein the first switching circuit comprises:
   a first switch configured to, in a first state, couple a first section of the first coil to a second section of the first coil and, in a second state, couple the first section of the first coil to a first node;
   a second switch configured to, in a first state, couple the second end of the first coil to a first output node and, in a second state, couple the first output node to the first node;
   a third switch configured to, in a first state, couple a first section of the second coil to a second section of the second coil and, in a second state, couple the first section of the second coil to second node different from the first node; and
   a fourth switch configured to, in a first state, couple the second end of the second coil to a second output node and, in a second state, couple the second output node to the second node.

5. A Guanella balun comprising:
   a substrate;
   a first pair of first and second generally planar coupled coils, interleaved with one another, and formed on the substrate by a CMOS process, each coil comprising multiple turns and having a respective input and output, the interleaved coils including a first plurality of crossings between turns of the respective coils, wherein each of the crossings of the first plurality of crossings is structured to match an impedance on each side of the crossing;
   a second pair of third and fourth generally planar coupled coils, interleaved with one another and formed on the substrate by the CMOS process, each coil comprising multiple turns and having a respective input and output, the interleaved coils including a second plurality of crossings between turns of the respective coils, wherein each of the crossings of the second plurality of crossings is structured to match an impedance on each side of the crossing; and
   an inductive coil formed on the substrate by the CMOS process, the inductive coil having first and second ends,
   wherein the first pair of coupled coils comprises:
       a first switching circuit coupled to the first coil and configured to, in a first state, electrically disconnect a section of the first coil; and
       a second switching circuit coupled to the second coil and configured to, in a first state, electrically disconnect a section of the second coil,
   wherein the output of the first coil is coupled to the input of the third coil and the first end of the inductive coil, and
   wherein a first diameter of the first pair of interleaved coils and a second diameter of the second pair of stacked coils are different from one another.

6. A Guanella balun, comprising:
   a substrate;
   a first pair of first and second generally planar coupled coils, interleaved with one another, and formed on the substrate by a CMOS process, each coil comprising multiple turns and having a respective input and output, the interleaved coils including a first plurality of crossings between turns of the respective coils, wherein each of the crossings of the first plurality of crossings is structured to match an impedance on each side of the crossing;
   a second pair of third and fourth generally planar coupled coils, interleaved with one another and formed on the substrate by the CMOS process, each coil comprising multiple turns and having a respective input and output, the interleaved coils including a second plurality of crossings between turns of the respective coils, wherein each of the crossings of the second plurality of crossings is structured to match an impedance on each side of the crossing;

an inductive coil formed on the substrate by the CMOS process, the inductive coil having first and second ends;

a first switching circuit coupled to the first coil and configured to, in a first state, bypass a section of the first coil;

a second switching circuit coupled to the second coil and configured to, in a first state, bypass a section of the second coil;

a third switching circuit coupled to the third coil and configured to, in a first state, bypass a section of the third coil; and a fourth switching circuit coupled to the fourth coil and configured to, in a first state, bypass a section of the fourth coil, wherein the output of the first coil is coupled to the input of the third coil and the first end of the inductive coil, and wherein a first diameter of the first pair of interleaved coils and a second diameter of the second pair of stacked coils are different from one another.

7. A Guanella balun, comprising:

a substrate;

a first pair of first and second generally planar coupled coils, interleaved with one another, and formed on the substrate by a CMOS process, each coil comprising multiple turns and having a respective input and output, the interleaved coils including a first plurality of crossings between turns of the respective coils, wherein each of the crossings of the first plurality of crossings is structured to match an impedance on each side of the crossing;

a second pair of third and fourth generally planar coupled coils, interleaved with one another and formed on the substrate by the CMOS process, each coil comprising multiple turns and having a respective input and output, the interleaved coils including a second plurality of crossings between turns of the respective coils, wherein each of the crossings of the second plurality of crossings is structured to match an impedance on each side of the crossing; and an inductive coil formed on the substrate by the CMOS process, the inductive coil having first and second ends, wherein the output of the first coil is coupled to the input of the third coil and the first end of the inductive coil, wherein a first diameter of the first pair of interleaved coils and a second diameter of the second pair of stacked coils are different from one another, and wherein the first pair of coupled coils comprises:
 a first switching circuit coupled to the first coil; and
 a second switching circuit coupled to the second coil,
 wherein the first coil comprises respective first and second sub-sections of coils,
 wherein the second coil comprises respective first and second sub-sections of coils,
 wherein the first switching circuit is configured to, in a first state, electrically disconnect the second sub-section of the first coil from the first sub-section of the first coil and from the input of the third coil, and
 wherein the second switching circuit is configured to, in a first state, electrically disconnect the second sub-section of the second coil from the first sub-section of the second coil and from the input of the fourth coil.

8. A Guanella balun, comprising:

a substrate;

a first pair of first and second generally planar coupled coils, interleaved with one another, and formed on the substrate by a CMOS process, each coil comprising multiple turns and having a respective input and output, the interleaved coils including a first plurality of crossings between turns of the respective coils, wherein each of the crossings of the first plurality of crossings is structured to match an impedance on each side of the crossing;

a second pair of third and fourth generally planar coupled coils, interleaved with one another and formed on the substrate by the CMOS process, each coil comprising multiple turns and having a respective input and output, the interleaved coils including a second plurality of crossings between turns of the respective coils, wherein each of the crossings of the second plurality of crossings is structured to match an impedance on each side of the crossing; and an inductive coil formed on the substrate by the CMOS process, the inductive coil having first and second ends, wherein the inductive coil comprises:
 a first coil section with first and second coil section ends, the first coil section end coupled to the second end of the first coil;
 a second coil section with third and fourth coil section ends the fourth coil end coupled to a ground node; and
 a switching circuit configured to, in a first state, couple the second coil section end to the third coil section end and to, in a second state, couple the second section end to the ground node, wherein the output of the first coil is coupled to the input of the third coil and the first end of the inductive coil, and wherein a first diameter of the first pair of interleaved coils and a second diameter of the second pair of stacked coils are different from one another.

9. The Guanella balun of claim 8, wherein:

a ratio of the first diameter to the second diameter is not an integer value.

10. The Guanella balun of claim 8, wherein each of the first pair of interleaved coils and the inductive coil has a same inductance value.

11. The Guanella balun of claim 8, wherein a shape of the inductive coil is one of rectangular or octagonal.

12. The Guanella balun of claim 8, wherein each of the first end of the second coil and the second end of the inductive coil is coupled to a first node.

13. The Guanella balun of claim 12, further comprising:

a ground plane disposed on the substrate, wherein the first node is coupled to the ground plane.

14. The Guanella balun of claim 8, wherein a width of a coil at each crossing and a spacing between the coils in each pair of interleaved coils are structured to provide the matched impedances.

15. A Guanella, comprising:

a substrate;

a first pair of first and second generally planar coupled coils, interleaved with one another, and formed on the substrate by a CMOS process, each coil comprising multiple turns and having a respective input and output, the interleaved coils including a first plurality of crossings between turns of the respective coils, wherein each of the crossings of the first plurality of crossings is structured to match an impedance on each side of the crossing;

a second pair of third and fourth generally planar coupled coils, interleaved with one another and formed on the substrate by the CMOS process, each coil comprising multiple turns and having a respective input and output, the interleaved coils including a second plurality of crossings between turns of the respective coils, wherein each of the crossings of the second plurality of crossings is structured to match an impedance on each side of the crossing;

an inductive coil formed on the substrate by the CMOS process, the inductive coil having first and second ends;

a first switch configured to, in a first state, couple a first section of the first coil to a second section of the first coil and, in a second state, couple the first section of the first coil to a first node;

a second switch configured to, in a first state, couple a first section of the second coil to a second section of the second coil and, in a second state, couple the first section of the second coil to a second node;

a third switch configured to, in a first state, couple a first section of the third coil to a second section of the third coil and, in a second state, couple the first section of the third coil to a third node;

a fourth switch configured to, in a first state, couple a first section of the fourth coil to a second section of the fourth coil and, in a second state, couple the first section of the fourth coil to a fourth node;

a fifth switch configured to, in a first state, couple the second section of the first coil to the first section of the third coil and, in a second state, couple the first section of the third coil to the first node;

a sixth switch configured to, in a first state, couple the second section of the third coil to a first output node and, in a second state, couple the first output node to the second node;

a seventh switch configured to, in a first state, couple the second section of the second coil to the first section of the fourth coil and, in a second state, couple the first section of the fourth coil to the third node; and an eighth switch configured to, in a first state, couple the second section of the fourth coil to a second output node and, in a second state, couple the second output node to the fourth node, wherein the output of the first coil is coupled to the input of the third coil and the first end of the inductive coil, and wherein a first diameter of the first pair of interleaved coils and a second diameter of the second pair of stacked coils are different from one another.

16. The Guanella balun of claim 15, wherein each of the switches further comprises one or more of:
at least one FET device;
a pin diode switch; or
a bipolar transistor (BJT).

17. The Guanella balun of claim 15, wherein the inductive coil comprises:
a ninth switch configured to, in a first state, couple a first section of the inductive coil to a second section of the inductive coil and to, in a second state, couple the second section of the inductive coil to a ground node.

* * * * *